(12) United States Patent
Sofia

(10) Patent No.: US 10,903,852 B2
(45) Date of Patent: Jan. 26, 2021

(54) COMPUTER SYSTEM SUPPORTING MULTIPLE ENCODINGS WITH STATIC DATA SUPPORT

(71) Applicant: International Business Machines Corporation, Armonk, NY (US)

(72) Inventor: Anthony T. Sofia, Hopewell-Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/738,217

(22) Filed: Jan. 9, 2020

(65) Prior Publication Data

US 2020/0145021 A1    May 7, 2020

Related U.S. Application Data

(63) Continuation of application No. 15/938,000, filed on Mar. 28, 2018, now Pat. No. 10,587,287.

(51) Int. Cl.
  *G06F 8/65*    (2018.01)
  *H03M 7/30*    (2006.01)
  *H03M 7/40*    (2006.01)

(52) U.S. Cl.
  CPC ............. *H03M 7/6011* (2013.01); *G06F 8/65* (2013.01); *H03M 7/3086* (2013.01); *H03M 7/40* (2013.01)

(58) Field of Classification Search
  CPC .............. G06F 8/65; H03M 7/30; H03M 7/40
  See application file for complete search history.

(56) References Cited

U.S. PATENT DOCUMENTS 6,092,701 A    7/2000    Waltenspuhl et al.
6,449,689 B1    9/2002    Corcoran et al.
(Continued)

FOREIGN PATENT DOCUMENTS

EP    2246786 A1    11/2010

OTHER PUBLICATIONS

Anthony T. Sofia et al., "Multi-Mode Compression Acceleration", U.S. Appl. No. 16/668,061, filed Oct. 30, 2019.
(Continued)

*Primary Examiner* — Henry Tsai
*Assistant Examiner* — Christopher A Daley
(74) *Attorney, Agent, or Firm* — Cantor Colburn LLP; Teddi Maranzano

(57) ABSTRACT

A computer system includes a host system, a hardware controller and an operating system. The host system runs an application that includes at least one compression library and that outputs a compression request to compress a data stream having an initial data-representation size. The hardware controller compresses the data stream according to an encoding scheme indicated by the compression library to generate a compressed data stream having a reduced data-representation size with respect to the initial data-representation size. The operating system provides a communication interface between the hardware controller and the application allowing the exchange of protocol data blocks between the application and the hardware controller. A protocol data block identifies an update status of the compression library and the OS. The computer system selectively operates in a first compression mode and a second compression based on the update status, thereby varying a compression ratio of the compressed data stream.

20 Claims, 9 Drawing Sheets

(56) References Cited

U.S. PATENT DOCUMENTS

| | | | |
|---|---|---|---|
| 6,661,839 | B1 | 12/2003 | Ishida et al. |
| 7,376,772 | B2 | 5/2008 | Fallon |
| 7,624,394 | B1 | 11/2009 | Christopher, Jr. |
| 7,640,381 | B1 | 12/2009 | Zhang et al. |
| 7,765,521 | B2 | 7/2010 | Bryant |
| 7,890,727 | B2 | 2/2011 | Mathews et al. |
| 8,108,353 | B2 | 1/2012 | Balachandran et al. |
| 8,250,578 | B2 | 8/2012 | Krishnamurthy et al. |
| 8,275,909 | B1 | 9/2012 | Rothstein |
| 8,312,210 | B2 | 11/2012 | Benhase et al. |
| 8,359,186 | B2 | 1/2013 | Sanesan et al. |
| 8,553,759 | B2 | 10/2013 | Fallon et al. |
| 8,610,604 | B2 | 12/2013 | Glass et al. |
| 8,712,978 | B1 | 4/2014 | Shilane et al. |
| 8,943,024 | B1 | 1/2015 | Gardner et al. |
| 9,385,749 | B1 | 7/2016 | Nam et al. |
| 9,442,754 | B1 | 9/2016 | Tsirkin |
| 9,514,146 | B1 | 12/2016 | Wallace et al. |
| 9,621,186 | B2 | 4/2017 | Nam et al. |
| 9,716,754 | B2 | 7/2017 | Swift |
| 9,733,854 | B2 | 8/2017 | Sharma et al. |
| 9,811,319 | B2 | 11/2017 | Weinsberg et al. |
| 9,929,748 | B1 | 3/2018 | Gopal et al. |
| 10,019,457 | B1 | 7/2018 | Stefani et al. |
| 10,374,629 | B1 | 8/2019 | Bradbury et al. |
| 2002/0101367 | A1 | 8/2002 | Geiger et al. |
| 2006/0212462 | A1 | 9/2006 | Heller et al. |
| 2009/0307711 | A1 | 12/2009 | Krishnamurthy et al. |
| 2010/0321218 | A1 | 12/2010 | Koratagere |
| 2011/0138270 | A1 | 6/2011 | Li et al. |
| 2011/0307907 | A1 | 12/2011 | Hwang et al. |
| 2013/0135122 | A1 | 5/2013 | Glass et al. |
| 2013/0135123 | A1 | 5/2013 | Golander et al. |
| 2013/0159811 | A1 | 6/2013 | Biran et al. |
| 2013/0268497 | A1 | 10/2013 | Baldwin et al. |
| 2013/0307709 | A1 | 11/2013 | Miller et al. |
| 2014/0086309 | A1 | 3/2014 | Beer-Gingold et al. |
| 2014/0351229 | A1 | 11/2014 | Gupta |
| 2014/0351811 | A1 | 11/2014 | Kruglick |
| 2014/0359219 | A1 | 12/2014 | Evans et al. |
| 2015/0066878 | A1 | 3/2015 | Agarwal et al. |
| 2016/0173123 | A1 | 6/2016 | Gopal et al. |
| 2017/0132241 | A1 | 5/2017 | Haverkamp et al. |
| 2017/0187388 | A1* | 6/2017 | Satpathy ............. H03M 7/6017 |
| 2017/0212487 | A1 | 7/2017 | Gupta et al. |
| 2017/0220404 | A1 | 8/2017 | Polar Seminario |
| 2019/0190538 | A1* | 6/2019 | Park ........................ G06N 3/02 |
| 2019/0305796 | A1 | 10/2019 | Sofia et al. |
| 2019/0312587 | A1 | 10/2019 | Sofia et al. |
| 2019/0312590 | A1 | 10/2019 | Sofia et al. |

OTHER PUBLICATIONS

Augonnet et al., "Data-Aware Task Scheduling on Multi-Accelerator Based Platforms," 2010 IEEE 16th International Conference on Parallel and Distributed Systems, pp. 291-298.

Campoalegre, Volumetric Medical Images Visualization on Mobile Devices. MS thesis. Universitat Politècnica de Catalunya, 2010.

D. Syrivelis et al., "On emulating hardware/software co-designed control algorithms for packet switches," SIMUTools '14: Proceedings of the 7th International ICST Conference on Simulation Tools and Techniques, pp. 132-141.

E. Horta et al., "Dynamic hardware plugins in an FPGA with partial run-time reconfiguration," DAC '02 Proceedings of the 39th annual Design Automation Conference, pp. 343-348.

J. Rapp et al., "Dynamically Configured Hardware Accelerator Functions," IP.com Disclosure No. IPCOM000171311D.

Kachouri et al., "Hardware design to accelerate PNG encoder for binary mask compression on FPGA." SPIE 9400, Real-Time Image and Video Processing. 2015.

Lettieri et al., "Data Compression in the V. 42bis Modems." WESCON/94. Idea/Microelectronics. Conference Record. IEEE, 1994. pp. 398-403.

List of IBM Patents or Patent Applications Treated as Related; (Appendix P), Filed Jan. 10, 2020; 2 pages.

Mauve, "Protocol enhancement and compression for x-based application sharing." University of Mannheim (1997): 11-12.

Meng et al., "Investigating applications portability with the Uintah DAG-based runtime system on PetaScale supercomputers," SC '13 Proceedings of the International Conference on High Performance Computing, Networking, Storage and Analysis, Article No. 96.

Nikkanen, . "uClinux as an embedded solution." Diss, Turku, Salo, Finland (2003).

Planas et al., "AMA: Asynchronous management of accelerators for task-based programming models," Procedia Computer Science 51 (2015): 130-139.

S. Chai et al., "Reconfigurable Streaming Architectures for Embedded Smart Cameras," IP.com Disclosure No. IPCOM000141061D.

Schroeter et al., "Dynamic configuration management of cloud-based applications," SPLC'12 Proceedings of the 16th International Software Product Line Conference—vol. 2, pp. 171-178.

Singh et al., "Enhancing LZW Algorithm to Increase Overall Performance." India Conference, 2006 Annual IEEE. IEEE, 2006. (4 pages).

Teimouri et al., "Revisiting accelerator-rich CMPs: challenges and solutions," DAC '15 Proceedings of the 52nd Annual Design Automation Conference, Article No. 84.

* cited by examiner

COMPUTER SYSTEM SUPPORTING MULTIPLE ENCODINGS WITH STATIC DATA SUPPORT

DOMESTIC PRIORITY

This application is a continuation of U.S. application Ser. No. 15/938,000, filed Mar. 28, 2018, the contents of which are incorporated by reference herein in its entirety.

BACKGROUND

The present invention relates to digital computer systems, and more particularly, to digital data compression schemes employed in digital computer systems.

Digital computer systems perform data compression to realize a more efficient use of finite storage space. The computer system typically includes a hardware component referred to as a compression accelerator, which accepts work requests or data requests from the host system to compress or decompress one or more blocks of the requested data. Traditional computer applications may require that compression services use a specific software data compression library, typically a zlib or compatible library, to execute a "DEFLATE" compatible compression algorithm to compress data and conserve storage space. The compression library generally provides a data stream based interface, which is utilized by the compression accelerator to compress/decompress the requested data. A typical data stream interface allows an application to break up input data to be compressed/decompressed in arbitrary ways across multiple requests.

SUMMARY

Various non-limiting embodiments of the present invention are directed to a computer system that includes a host system, a hardware controller and an operating system. The host system runs an application that includes at least one compression library and that outputs a compression request to compress a data stream having an initial data-representation size. The hardware controller compresses the data stream according to an encoding scheme indicated by the compression library to generate a compressed data stream having a reduced data-representation size with respect to the initial data-representation size. The operating system provides a communication interface between the hardware controller and the application allowing the exchange of protocol data blocks between the application and the hardware controller. A protocol data block identifies an update status of the compression library and the OS. The computer system selectively operates in a first compression mode and a second compression based on the update status, thereby varying a compression ratio of the compressed data stream.

One or more additional non-limiting embodiments of the present invention are also directed to a computer-implemented method of controlling a computer system to compress data. The method comprises running, on a host system of the computer system, an application including at least one compression library, and outputting a compression request, via the application, to compress a data stream having an initial data-representation size. The method further comprises compressing the data stream, via a hardware controller, according to an encoding scheme indicated by the compression library to generate a compressed data stream having a reduced data-representation size with respect to the initial data-representation size, and establishing, via an operating system (OS) installed on the computer system, a data interface between the hardware controller and the application. The method further comprises exchanging at least one protocol data block between the application and hardware controller to identify an update status of at least one of the compression library and the OS. The method further comprises selectively operating the computer system in a first compression mode and a second compression based on the update status, thereby varying a compression ratio of the compressed data stream.

One or more additional non-limiting embodiments of the invention are also directed to a computer program product to control a computer system to compress data. The computer program product comprises a computer readable storage medium having program instructions embodied therewith. The program instructions are executable by an electronic computer processor to perform operations comprising running, on a host system of the computer system, an application including a compression library, and outputting a compression request, via the application, to compress a data stream having an initial data-representation size. The operations further include compressing the data stream, via a hardware controller, according to an encoding scheme indicated by the compression library to generate a compressed data stream having a reduced data-representation size with respect to the initial data-representation size. The operations further include establishing, via an operating system (OS) installed on the computer system, a data interface between the hardware controller and the application, and exchanging at least one protocol data block between the application and hardware controller to identify an update status of at least one of the compression library and the OS. The operations further include selectively operating the computer system in a first compression mode and a second compression based on the update status, thereby varying a compression ratio of the compressed data stream.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
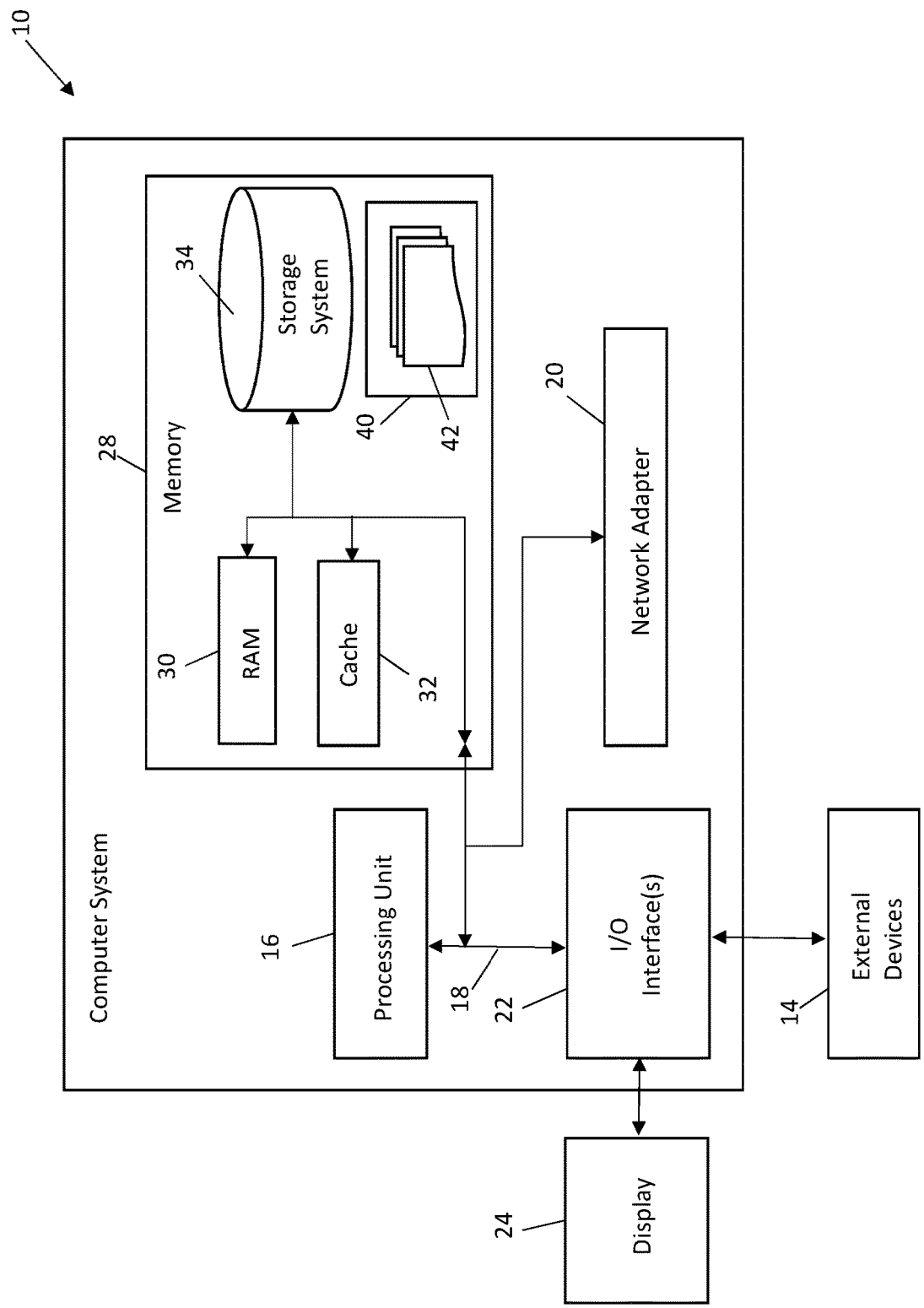
FIG. 1 is a block diagram illustrating a computer system which is capable of compressing data in accordance with various embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, there are instances during operation of a digital computer system where code is linked statically to calling programs or applications. Embedded in this statically linked code are architectural parameters that are passed to an operating system (OS) of the computer system. One such case is the compression library such as, for example, the open source library zlib. The compression library works together with the OS to perform data compression and/or decompression, sometimes referred to as "deflation" and "inflation", respectively. In other words, conventional compression libraries are statically linked to software products or applications, and indicate to the compression accelerator the specific encoding to be used to compress the requested data or data stream.

The communication between the compression library and the OS is facilitated through architected parameter blocks, as well as an understanding of the compressed encoding to be used to compress blocks of data. Based on the understanding of the compressed encoding, the compression library can always perform its processing even in the event that the OS is changed or updated. For instance, traditional compression schemes operated under the premise that there is an agreement between the hardware component (e.g., the compression accelerator), the OS, and the compression library to use only a specific encoding scheme to compress data, which in turn used a static preset "end of block" (EOB) symbol. The EOB symbol is utilized to indicate the completion or "end" of one compressed data block, thereby providing a reference point for the start of the next data block.

The traditional compression scheme described above allows the compression library to always be aware of the EOB symbol used for a compression event. For instance, a user of the compression library can at any point initiate a flush operation, which will terminate compression of a current data block and cause the compression library to inject control information into the compressed data stream. This control information causes the current block of compressed data to be closed, and in turn, requires the compression library to inject the EOB symbol into the block in order to indicate the end of a previous compression block and the start of a new data block. Thus, when the encoding is returned from the hardware component and the OS, the static preset EOB symbol can be predicated by the compression library (i.e., is always made aware to the compression library) and injected accordingly.

As technology advances, the hardware component (e.g., the compression accelerator), the OS and/or the compression library will need to be updated and optimized. As a result, different encoding schemes, which provide compression optimization, will be implemented in the computer system than where previously used with older legacy platforms. The inevitable optimization and updating of these computing elements, however, do not change the fact that the compression library is statically linked or embedded into software products and computer applications which expect a specific encoding to be included in the data stream.

There will be instances, however, when the OS is independently updated from the compression library, or vice versa. In these cases, the OS and the compression library must be aware as to whether one another is currently updated, and if not, must still be capable of performing data compression. One strategy to ensure data compression is always available, regardless of the updating status of the OS and compression library, includes forcing the OS to always "break apart" the data blocks that are being compressed, and add additional operating parameters into the compressed data stream. The legacy or non-updated compression library, therefore, can continue applying the legacy preset EOB symbol to the compressed data stream. This strategy, however, makes it necessary to include additional data, thereby reducing the overall compression ratio. The compression ratio is sometimes described as a reduction in data-representation size produced by an applied data compression algorithm and can be defined as the ratio between the uncompressed size and compressed size. Thus, as the compression ratio increases, a more efficient use of the computer system's storage space is achieved thereby improving the overall performance of the computer system.

Turning now to an overview of the aspects of the invention, one or more embodiments of the invention address the above-described shortcomings of the prior art by providing a digital computer system that supports multiple encodings while still providing static data support. That is, various embodiments described herein provide a digital computer system that can compress data according to different encoding schemes, while still supporting legacy encoding that utilizes statically linked software code such as the zlib compression library, for example.

With reference now to FIG. 1, a computer system 10 is illustrated in accordance with a non-limiting embodiment of the present disclosure. The computer system 10 may be based on the z/Architecture, for example, offered by International Business Machines Corporation (IBM). The architecture, however, is only one example of the computer system 10 and is not intended to suggest any limitation as to the scope of use or functionality of embodiments described herein. Regardless, computer system 10 is capable of being implemented and/or performing any of the functionality set forth hereinabove.

Computer system 10 is operational with numerous other general purpose or special purpose computing system environments or configurations. Examples of well-known computing systems, environments, and/or configurations that may be suitable for use with computer system 10 include, but are not limited to, personal computer systems, server computer systems, thin clients, thick clients, cellular telephones, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system 10 may be described in the general context of computer system-executable instructions, such as program modules, being executed by the computer system 10. Generally, program modules may include routines, programs, objects, components, logic, data structures, and so on that perform particular tasks or implement particular abstract data types. Computer system 10 may be practiced in distributed cloud computing environments where tasks are performed by remote processing devices that are linked through a communications network. In a distributed computing environment, program modules may be located in both local and remote computer system storage media including memory storage devices.

As shown in FIG. 1, computer system 10 is shown in the form of a general-purpose computing device, also referred to as a processing device. The components of computer system may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system 10 may include a variety of computer system readable media. Such media may be any available media that is accessible by computer system/server 10, and it includes both volatile and non-volatile media, removable and non-removable media.

System memory 28 can include computer system readable media in the form of volatile memory, such as random access memory (RAM) 30 and/or cache memory 32. Computer system 10 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the disclosure.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system 10 may also communicate with one or more external devices 14 such as a keyboard, a pointing device, a display 24, etc.; one or more devices that enable a user to interact with computer system/server 10; and/or any devices (e.g., network card, modem, etc.) that enable computer system/server 10 to communicate with one or more other computing devices. Such communication can occur via Input/Output (I/O) interfaces 22. Still yet, computer system 10 can communicate with one or more networks such as a local area network (LAN), a general wide area network (WAN), and/or a public network (e.g., the Internet) via network adapter 20. As depicted, network adapter 20 communicates with the other components of computer system 10 via bus 18. It should be understood that although not shown, other hardware and/or software components could be used in conjunction with computer system 10. Examples include, but are not limited to: microcode, device drivers, redundant processing units, external disk drive arrays, RAID systems, tape drives, and data archival storage systems, etc.

Figure 2:
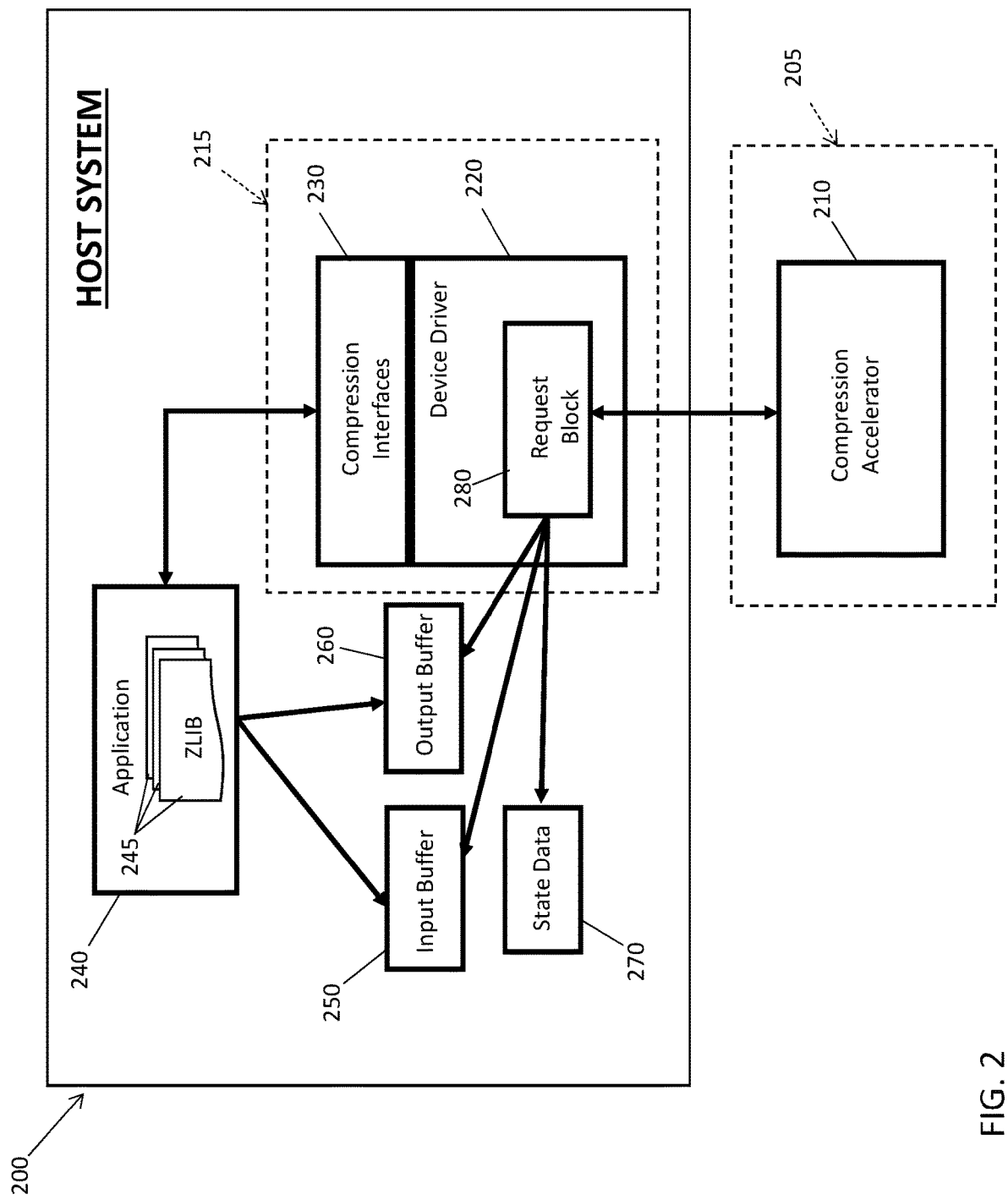
FIG. 2 is a block diagram of a host system in signal communication with a hardware component according to a non-limiting embodiment.

With reference to FIG. 2, a host system 200 is illustrated in signal communication with one or more computing hardware components 205 according to a non-limiting embodiment. The host system 200 and the hardware component 205 can be implemented using the processing unit 16 in combination with the other components of the computer system 10 described in FIG. 1.

The hardware component 205 includes, but is not limited to, an electronic hardware controller installed with a compression accelerator 210. According to a non-limiting embodiment, the compression accelerator 210 can be shared among multiple host systems, but for simplicity only one host system 200 is shown in FIG. 2. The interaction between the compression accelerator 210 and the host system 200 can be controlled by the host system's operating system (OS) 215. The host OS 215 includes a device driver 220 capable of providing one or more compression interfaces 230.

The host system 200 is capable of running one or more applications 240 to facilitate data compression. The application 240 is installed with one or more compression libraries 245. The figures reference a "zlib" in the figures; however, the disclosure is of course not limited to any particular library. The compression library 245 is compatible with the compression interfaces 230 of the OS 215 and informs the compression accelerator 210 (e.g., via one or more parameter data blocks) of the specific encoding scheme to be used to compress the requested data or data stream.

In one or more embodiments, uncompressed data is obtained by the application and is passed by a pointer to the compression library 210. The compression library 210 passes the pointer to the operating system 215 for the data buffer. In turn, the operating system 215 passes the buffer indicated by the pointer to the hardware 205, and the compression accelerator 210 will perform an initial data compression on the data provided by the Application. The initial compressed data can be stored in output buffer, and then passed by a pointer between the OS 215 and the compression library 245. In the event a flush operation is performed, then the compression library 245 possess that compressed output buffer of data that it can operate on. The operations of the compression library 245 include performing an additional compression operation such as a "DEFLATE" operation, for example, on the compressed data obtained from the output buffer to generate final compressed data. The "DEFLATE" operation can include injecting control data, such as an EOB symbol, into the EOB of the compressed data obtained from the output buffer.

Various types of compression algorithms can be utilized in the computer system 10 such as, for example, an adaptive lossless data compression (ALDC) family of products which utilize a derivative of Lempel-Ziv encoding to compress data. As a general compression technique, the Lempel-Ziv algorithm integrates well into systems required to handle many different data types. This algorithm processes a sequence of bytes by keeping a recent history of the bytes processed and pointing to matching sequences within the history. Compression is achieved by replacing matching byte sequences with a copy pointer and length code that together are smaller in size than the replaced byte sequence.

The compression algorithm can also include the "DEFLATE" compression format, which uses a combination of the LZ77 algorithm (which removes repetitions from the data) and Huffman coding. The Huffman encoding is entropy encoding that is based on a "Huffman tree". In order to Huffman encode and decode data, a system must know in advance that the Huffman tree is being used. In order to accommodate decompression (e.g., an "Inflate" operation), the Huffman tree is written at the header of every compressed block. In one embodiment, two options are provided for Huffman trees in the Deflate standard. One option is a "static" tree, which is a single hard-coded Huffman tree, known to all compressors and decompressors. The advantage of using this static tree is that its description does not have to be written in the header of a compressed block, and is ready for immediate decompression. On the other hand, "dynamic" trees are tailored for the data block at hand and an exact description of the dynamic tree must therefore be written to the output.

Huffman encoding may also use a variable-length code table based on entropy to encode source symbols, and as previously mentioned, is defined either as either static or dynamic. In static Huffman coding, each literal or distance is encoded using a fixed table (SHT) that is defined in the RFC. In dynamic Huffman coding, however, special coding tables (DHT) are constructed to better suit the statistics of the data being compressed. In most cases, using DHT achieves better compression ratio (e.g., quality) when compared to SHT, at the expense of degrading the compression rate (e.g., performance) and adding design complexity. The static and dynamic Huffman encoding methods best reflect the built-in tradeoff between compression rate and ratio. The static Huffman method may achieve a lower compression ratio than is possible. This is due to using a fixed encoding table regardless of the content of the input data block. For example, random data and a four-letter DNA sequence would be encoded using the same Huffman table.

The compression library 245 can be implemented in the application 240 as a software library used for deflation/inflation and can be an abstraction of a compression algorithm. The compression library 245 obtains this compressed data, and further performs a "DEFLATE" operation on the compressed data to generate a final compressed data. The "DEFLATE" operation includes inject control data, such as an EOB symbol, into the EOB.

In at least one embodiment, the compression library 245 allows the application 240 to break up input data to be deflated/inflated in arbitrary ways across multiple requests and provides arbitrary sized output buffers to hold the results of the deflate/inflate operation. Since the zlib compression algorithm, for example, employs the Lempel-Ziv77 type compression followed by a layer of a Huffman encoding, it achieves an increased compression ratio when the techniques are performed effectively. Even more so, the output adheres to a well-accepted standard (e.g., the DEFLATE compression format). As such, it is supported by a wide variety of web browsers and applications. Several different versions of the compression library 245 can exist and can be included with a given application 240. The compression library 245 can also allow for either the off-the-shelf software compression or decompression, along with providing a second path that can optionally communicate with the OS 215 to perform compression and/or decompression.

To compress the requested data, the application 240 outputs one or more compression requests to the compression interface 230 of the OS 215. On each request, the application 240 can supply an input buffer 250 with the data to be processed and an output buffer 260 where the processed data results are stored. On the first request of a stream, the device driver 220 of the OS 215 receives a data control block from compression library 245 which includes a stream state for the data stream and may exist for the life of the data stream according to an embodiment. For each request, the device driver 220 can generate a request block 280, which can include references to the stream state and the application's input buffer 250 and output buffer 260.

To begin processing the compression request, the compression accelerator 210 reads the request block 280, and processes the data in the input buffer 250 to generate compressed or and/or decompressed data using an installed compression algorithm. As described herein, various compression algorithms can be employed including, but not limited to, the DEFLATE compression algorithm and ALDC algorithms. The resulting compressed data can be saved in the output buffer 260. According to a non-limiting embodiment, the compression accelerator 210 can also save an updated stream state when directed by the device driver 220.

The hardware component 205 (e.g., the compression accelerator 210), the OS 215, and/or the compression library 245 can each be updated, and the timing at which they are updated can vary. Thus, for example, the OS 215 may be updated while the compression library 245 is not updated, and vice versa. Although the computer system 10 operates at its full potential (e.g., provides the most efficient compression ratio) when the hardware component 205, the OS 215, and/or the compression library 245 are all updated to the most up-to-date versions and compatible with one another, the computer system 10 is also capable of performing compression when one or more of the compression accelerator 210, the OS 215, and/or the compression library 245 are not up-to-date. In the scenario where the compression library is updated, but the OS 215 is not up-to-date, for example, the computer system 10 is capable of supporting several different versions of the compression library 245. In this manner, an older version of the compression library 245 can be utilized by the OS 215 to perform data compression.

Although the above scenario describes supporting several different compression library versions, the same holds true for different versions of the OS 215 and/or the hardware component 205 (e.g., the compression accelerator 210). For example, the hardware component 205 can employ an old version or up-to-date version of the compression accelerator 210. The OS 215 can exist at either at an older level/older version or an updated version/up-to-date level. The compression library 245 can exist in an older version or an updated version. The updated version of the compression library 245, for instance, provides optimized data compression compared to outdated or legacy versions.

In at least one embodiment, the hardware component 205, the OS 215, and/or the compression library 245 can interact with each other to selectively invoke a full operating compression mode where the computer system 10 performs data compression at its full potential (e.g., at the most efficient compression ratio), or at a partial operating compression mode where the computer system 10 performs data compression, albeit at a lower compression ratio efficiency. The interaction can be facilitated by introducing modifications to the hardware component 205, the OS 215, and/or the compression library 245.

A first modification includes employing a dynamic EOB flag indicator or an EOB bit field with the compression library 245. The compression library 245 can selectively turn off the dynamic EOB flag, e.g., set the EOB bit field to a first value (e.g., a "0" bit), or can turn on the dynamic EOB flag, e.g., set the EOB bit field to a second value (e.g., a "1" bit). When turned off, the dynamic EOB flag indicates that the compression library 245 understands to use a static preset EOB symbol known by the compression library 245. That is, the static EOB symbol is known by the compression library 245 prior to the compression request. When turned on, however, the dynamic EOB flag indicates that the compression library 245 understands to use a dynamically set EOB symbol. The dynamically set EOB symbol is dynamically determined by the OS 215 and can vary from one data compression request to the next. Thus, the dynamic EOB symbol is not known prior to the compression request. Therefore, when the dynamic EOB flag is turned on, the compression library 245 can either calculate the dynamic EOB symbol (as indicated by the OS 215) or it can be provided by the OS 215 for a given data compression request.

A second modification is applied to the application 240 and allows the application 240 to be re-linked with an updated compression library 245 (a most up-to-date version of the compression library). When the application 240 is re-linked with an updated compression library 245, the application 240 sets the dynamic EOB flag to the second value, i.e., turns on the EOB flag. The most up-to-date version of the compression library 245 may include updated encoding definitions and/or protocols that may not be supported or compatible with the current update status of the OS 215. In cases where an application 240 did not re-link their compression library 245 or the compression library 245 is outdated, the dynamic EOB flag is set to the first value, i.e., is turned off.

Additional modifications are also applied to the hardware component 205 and the OS 215. In at least one embodiment, the OS 215 can be updated independently of the compression library 245 but is tied to the update status of the hardware component 205. For example, when the hardware component 205 is updated (e.g., replaced with an up-to-date version), then a new OS 215 or updated OS 215 (e.g., the most up-to-date version of the OS) is installed to provide an updated device driver 220 that is compatible with the new or updated hardware component 205.

The OS 215 can also be optionally updated without updating the hardware component 205. In this scenario, however, a new device driver 220 will not be used because the existing device driver 220 associated with the current hardware component 205 is not updated. Accordingly, the OS 215 will switch off an encoding status flag indicator or encoding status bit field indicating that an updated encoding scheme was not used to generate a different EOB symbol, e.g., a legacy present static EOB symbol should be included in the EOB.

When the EOB flag associated with the compression library 245 is not available or is switched off, the OS 215 will modify the compression scheme by closing a data block with the new encoding and opening a new additional block that includes data indicating the old encoding scheme and/or the preset static EOB symbol to be provided to the compression library 245. In this manner, the OS 215 provides a compatible view back to an older version of the compression library 245.

When, however, the EOB flag associated with the compression library 245 is available and is turned on, the OS 215 can turn on the encoding status flag indicator to inform the compression library 245 that a custom or updated encoding scheme was used to compress the current data block. In response to detecting that the encoding status flag is on, the compression library 245 either calculates the dynamic EOB symbol or obtains the dynamic EOB symbol from the OS 215, and uses the dynamic EOB symbol when processing the EOB block for the current data compression event.

Accordingly, the various modifications described above facilitate compatibility between updated and non-updated states of the hardware component 205, the OS 215, and the compression library 245. When the hardware component 205, the OS 215, and/or the compression library 245 are not up-to-date, the computer system 10 invokes a partial operating compression mode where the computer system 10 performs data compression, albeit at a lower compression ratio efficiency. When, however, each of the hardware component 205, the OS 215, and the compression library 245 are up-to-date, the computer system 10 can operate in a full operating compression mode which supports the new or up-to-date encoding scheme, and performs data compression at its full potential (e.g., at the most efficient compression ratio).

Figure 3:
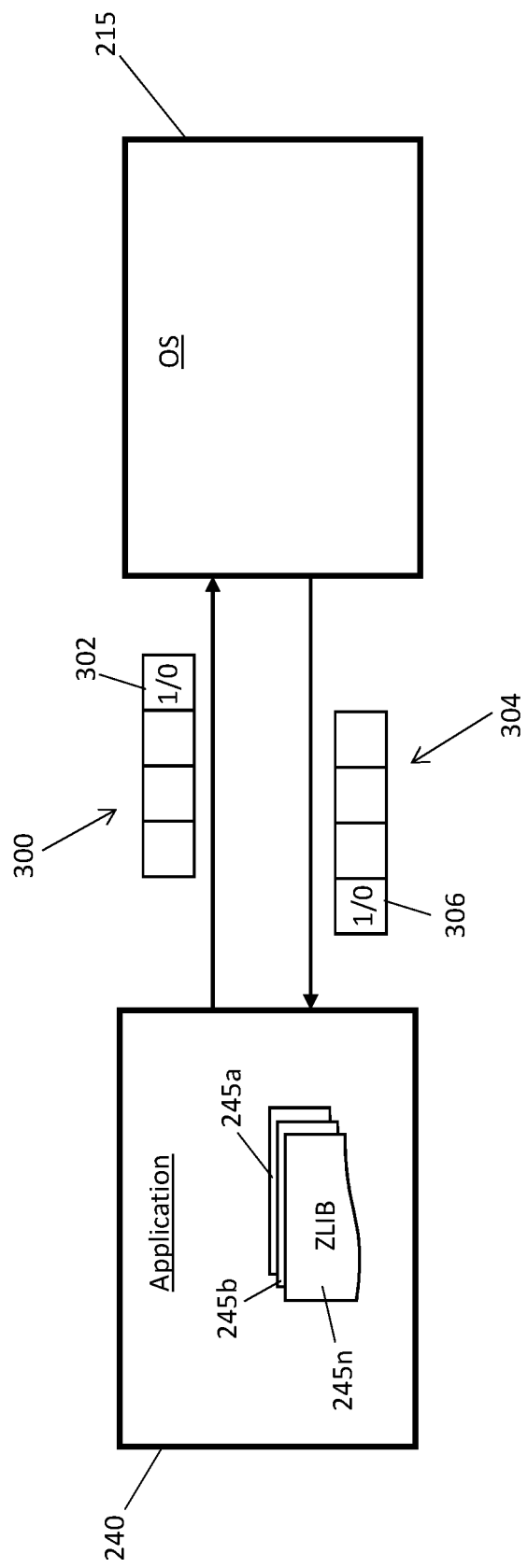
FIG. 3 is a block diagram illustrating an update status communication exchange between an operating system and a compression library according to a non-limiting embodiment.

Turning now to FIG. 3, a block diagram illustrates a status communication exchange between a given application 240 and the OS 215 according to a non-limiting embodiment. The application 240 and OS 215 exchange protocol data blocks 300 and 304 to inform one another of their update status, i.e., their compatibility with one another. The application 240 can be installed with a plurality of compression libraries 245*a*-245*n*. In at least one embodiment, the compression libraries 245*a*-245*n* can include a legacy version of the compression library (e.g., 245*a*) and one or more updated compression libraries (e.g., 245*b*-245*n*). The OS 215 can operate according to a legacy OS or non-updated OS version or can operate according to an updated OS version. In a non-limiting embodiment, the application 240 can initiate the data exchange by first outputting the compression library protocol data block 300 to the OS 215 indicating the update status of the compression library, i.e., whether the current version of the compression library 245 is fully compatible with the current version of the OS 215. The OS 215 then replies with the OS protocol data block 304 indicating the update status of the OS 215, i.e., whether the current status of the OS 215 is fully compatible with the current status of the compression library 245. In another non-limiting embodiment, the OS 215 can initiate the data exchange by first outputting the OS protocol data block 304 to the application 240 indicating the update status of the OS 215. The application 240 then replies with the compression library protocol data block 300 indicating the update status of the compression library currently in use.

The compression library protocol data block 300 includes a dynamic EOB bit field 302 that serves as a dynamic EOB flag. The compression library 245 can dynamically set the EOB bit field 302 to the first value (e.g., a "0" bit) to indicate that application 240 is installed with an updated compression library (e.g., compression library 245*n*), or can be dynamically set the EOB bit field 302 to the second value (e.g., a "1" bit) to indicate that the compression library is not updated, i.e., is installed with only a legacy compression library (e.g., compression library 245*a*).

The OS protocol data block 304 includes an encoding status bit field 306 that serves as an encoding status flag. The OS 215 can dynamically set the encoding status bit field 306 to the first value (e.g., a "0" bit) to indicate that the OS 215 is not updated to support an encoding scheme that supports dynamically set EOB symbols, or can dynamically set the encoding status bit field 306 to the second value (e.g., a "1" bit) to indicate that the OS 215 is updated to support an encoding scheme that supports dynamically set EOB symbols.

Figure 4:
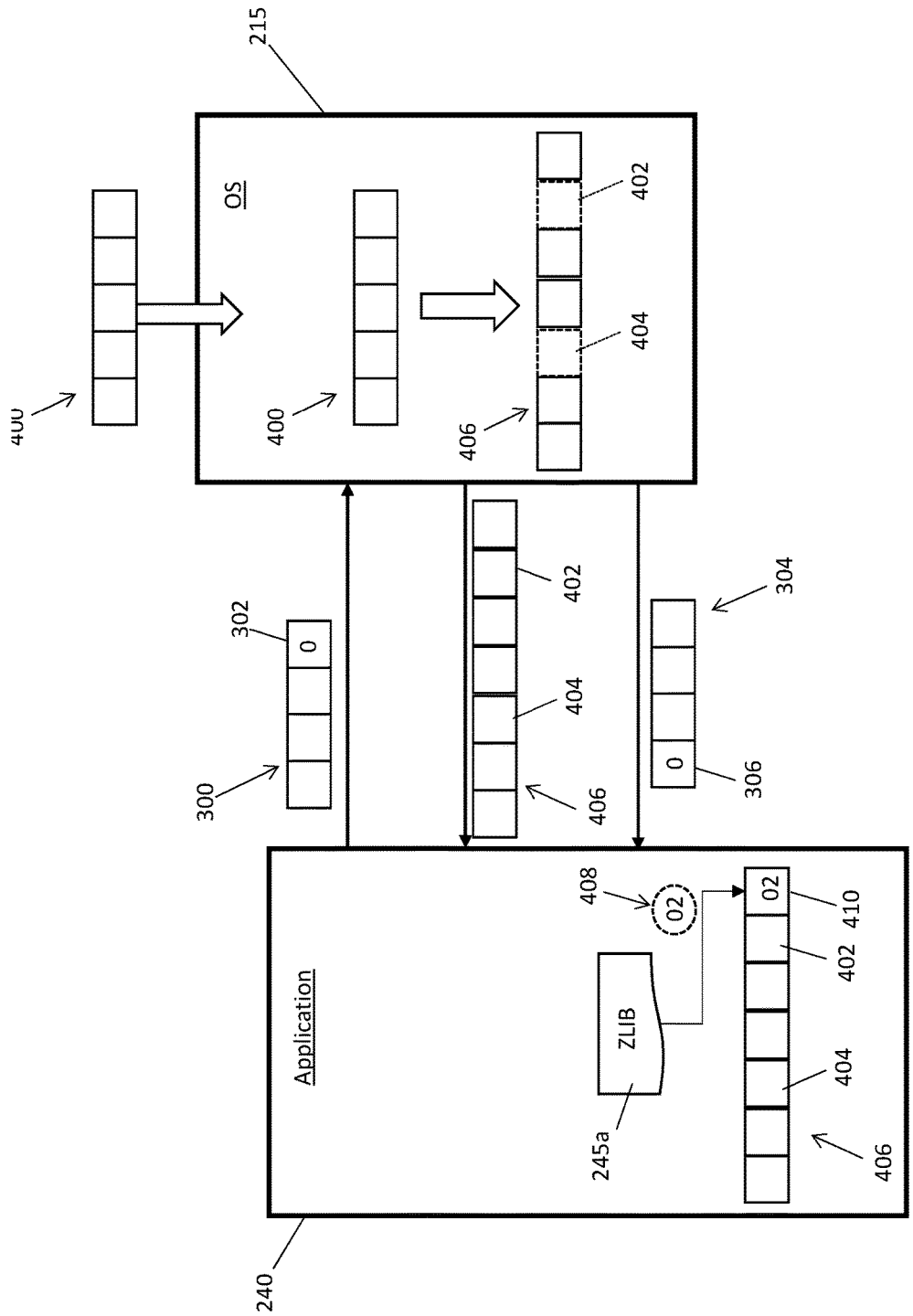
FIG. 4 illustrates a compression scenario during which the compression library is not updated according to a non-limiting embodiment.

With reference to FIG. 4, a data compression scenario is illustrated during which the application 240 includes a compression library 245*a* that is not updated. The application 240 establishes communication with the OS 215 to request data compression of a data stream 400. The application 240 also generates the compression library protocol data block 300 and sets the dynamic EOB bit field 302 to the first value (e.g., a "0" bit) to indicate that the compression library 245*a* is not updated.

The OS 215 analyzes the compression library protocol data block 300 and determines that the compression library 245*a* cannot support an updated encoding scheme, based on the first value (e.g., "0" bit value) residing in the dynamic EOB bit field 302. Accordingly, the OS 215 compresses the data stream 400, and adds one or more additional data blocks 402 and 404 to generate a modified data stream 406 that is compatible with the processing capability of the non-updated compression library 245*a* (e.g., the legacy compression library 245*a*).

The OS 215 delivers the compressed modified data stream 406 to the application 240, along with the OS protocol data block 304. The OS protocol data block 304 includes the encoding status bit field 306 that is set to the first value (e.g., a "0" bit) because the compression library 245*a* is not updated. Because the compression library 245 is operating under the assumption that a non-updated encoding scheme is being used, the compression library injects the static EOB symbol 408 corresponding to the non-updated encoding scheme into the EOB 410.

Figure 5:
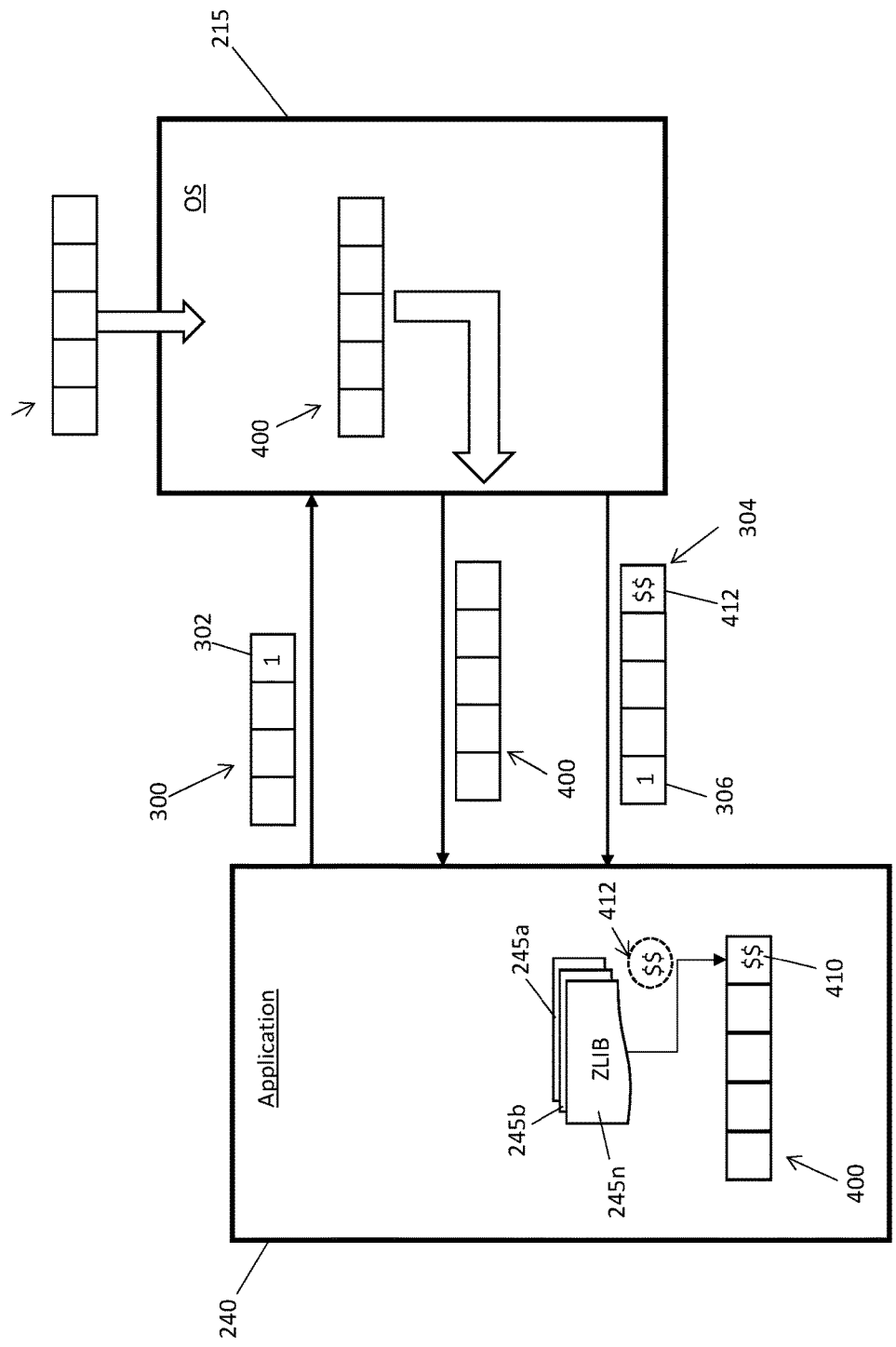
FIG. 5 illustrates a compression scenario during which the compression library is updated according to a non-limiting embodiment.

Turning to FIG. 5, a data compression scenario is illustrated during which the application 240 includes an updated compression library 245*n* according to a non-limiting embodiment. The application 240 establishes communication with the OS 215 to request data compression of a data stream 400 and generates the compression library protocol data block 300. In this scenario, however, the dynamic EOB bit field 302 is set to the second value (e.g., a "1" bit) to indicate that the application 240 is installed with an updated compression library (e.g., 245*n*).

Accordingly, the OS 215 analyzes the compression library protocol data block 300 and determines that the updated compression library 245*n* supports an updated encoding scheme based on the second value (e.g., "1" bit value) residing in the dynamic EOB bit field 302. The OS 215 compresses the data stream 400, but in this scenario does not add the additional data blocks 402 and 404 (see FIG. 4) because the compressed data stream 400 is already compatible with the processing capability of the updated compression library 245*n*. The OS 215 delivers the compressed data stream 400 to the application 240, along with the OS protocol data block 304. In this scenario, however, the OS protocol data block 304 includes the encoding status bit field 306 that is set to the second value (e.g., a "1" bit) because the compression library 245*n* is updated. In addition, the OS protocol data block 304 includes an EOB symbol 412 which includes a dynamically set EOB symbol (e.g., $$, %%, 01, AA, etc.) determined by the OS 215. The EOB symbol 412 can either be included in an existing field of the OS protocol data block 304, or a new field can be added to the OS protocol data block 304.

The compression library 245n analyzes the second value (e.g., "1" bit value) residing in the encoding status bit field 306, and determines that a new or updated encoding scheme that is compatible with its updated compression library 245n was applied to the compressed data stream 400. Accordingly, the updated compression library 245n injects the dynamically determined EOB symbol 412 (e.g., $$, %%, 01, AA, etc.) into the EOB 410 included in the compressed data stream 400, which indicates an end point of the compressed data stream 400.

Figure 6:
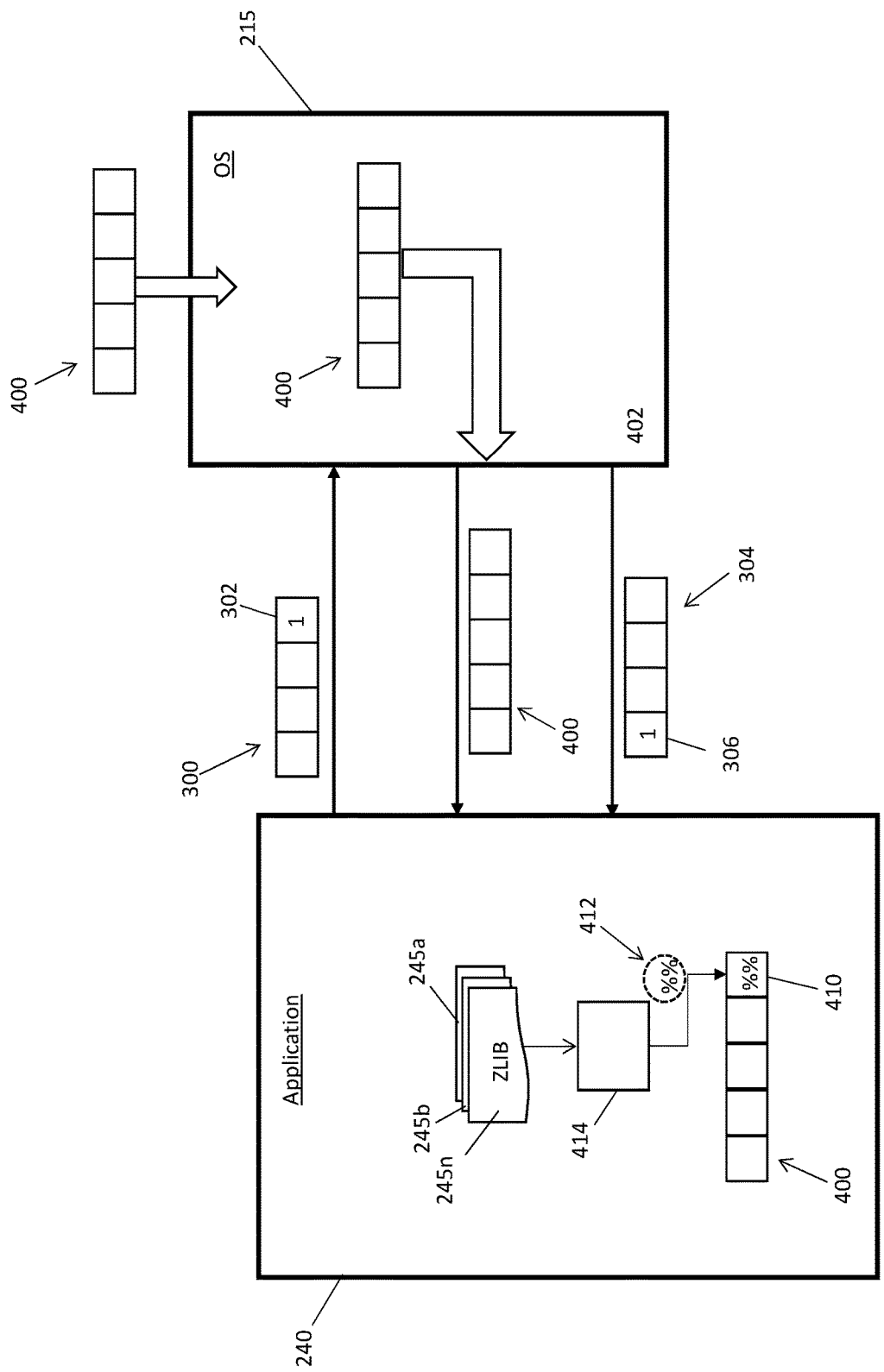
FIG. 6 illustrates a compression scenario during which the compression library is updated according to another non-limiting embodiment.

Turning to FIG. 6, a data compression scenario is illustrated during which the application 240 includes an updated compression library 245n according to another non-limiting embodiment. The data compression scenario is similar to the scenario described with respect to FIG. 5. In the scenario of FIG. 6, however, the application 240 includes a dynamic EOB symbol generator 414, which dynamically generates an EOB symbol 412 to be inserted in the EOB 410. More specifically, the OS 215 delivers the compressed data stream 400 to the application 240, along with the OS protocol data block 304. The OS protocol data block 304 includes the encoding status bit field 306 that is set to the second value (e.g., a "1" bit) because the compression library 245n is updated as described above. In this scenario, however, the OS protocol data block 304 does not include the dynamically determined EOB symbol 412 because this dynamic EOB symbol 412 will be generated by the dynamic EOB symbol generator 414 as described below.

The compression library 245n analyzes the second value (e.g., "1" bit value) residing in the encoding status bit field 306, and determines that a new or updated encoding scheme that is compatible with its updated compression library 245n was applied to the compressed data stream 400. Accordingly, the updated compression library 245n commands the dynamic EOB symbol generator 414 to generate a dynamic EOB symbol 412 (e.g., $$, %%, 01, AA, etc.), which is then injected into the EOB 410 included in the compressed data stream 400 to indicate the end point of the compressed data stream 400.

Figure 7A:
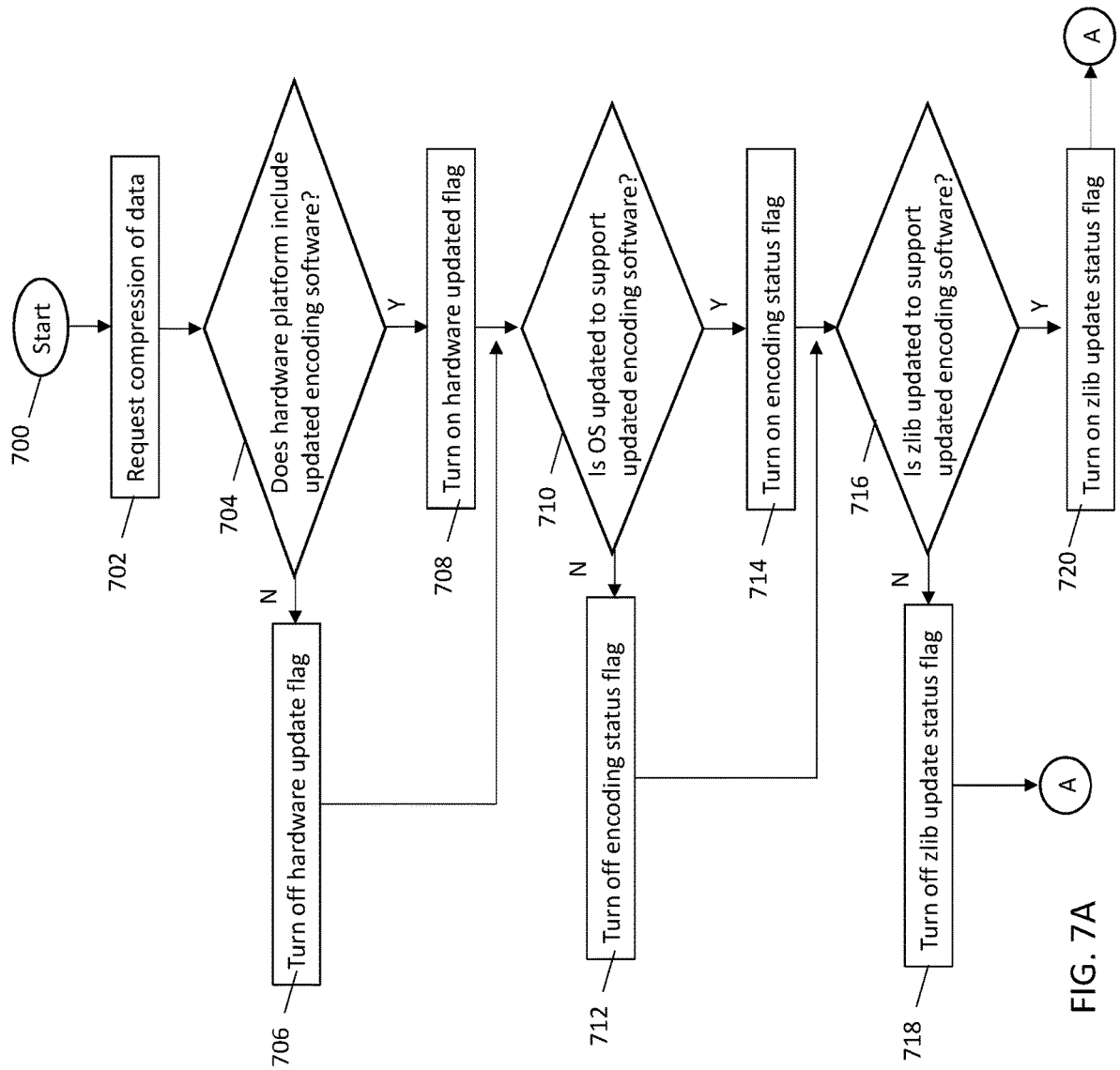
FIGS. 7A-7C is a flow diagram illustrating a method of controlling data compression performed by a computer system according to a non-limiting embodiment.
Figure 7B:
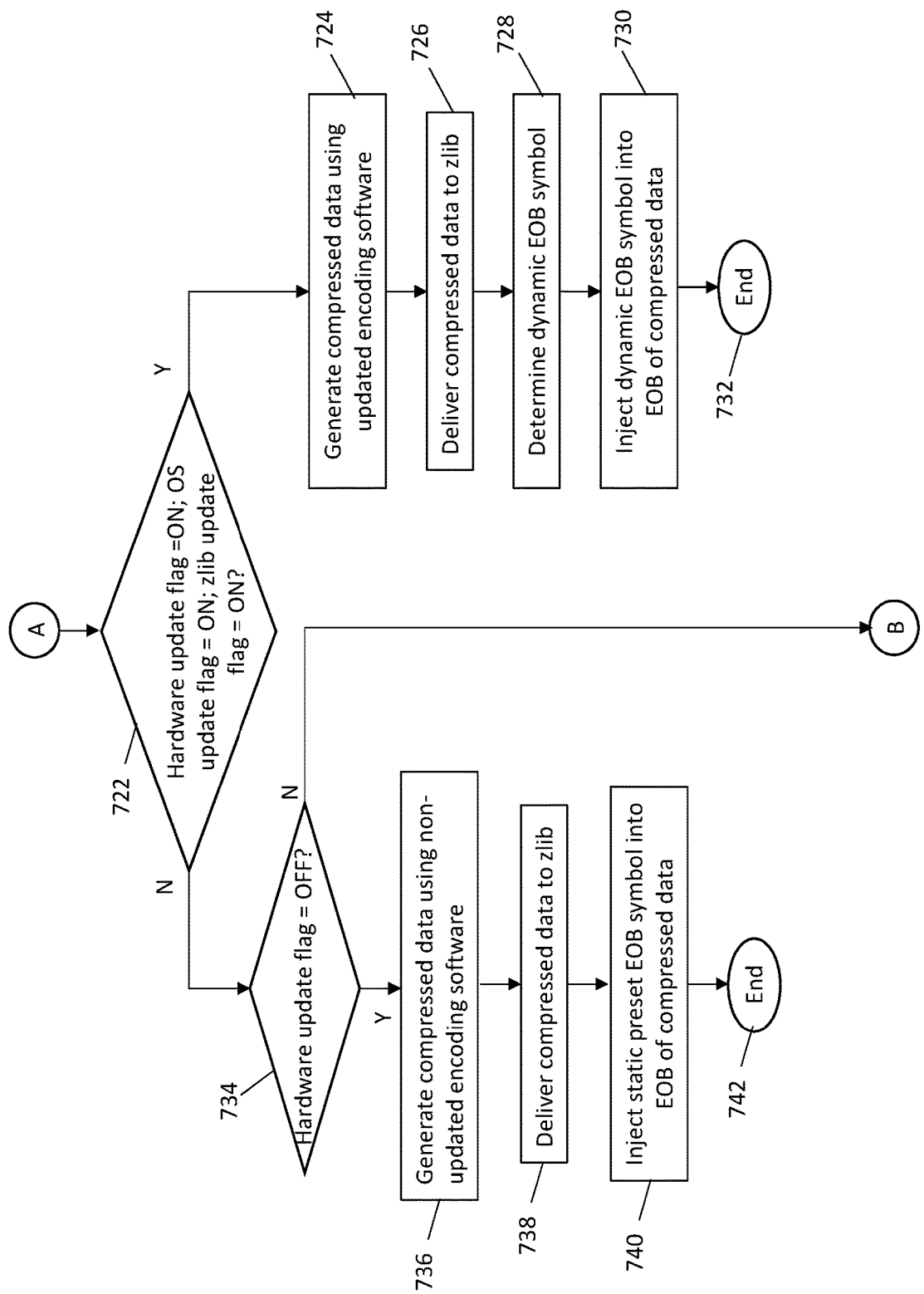
Figure 7C:
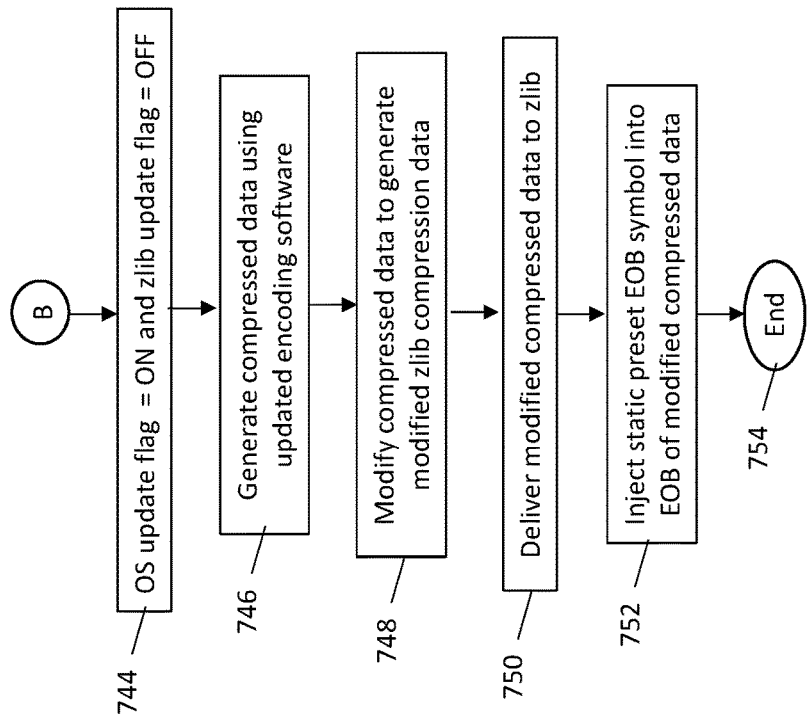

With reference now to FIGS. 7A-7C, a method of controlling data compression performed by the computer system 10 is illustrated according to a non-limiting embodiment. The method begins at operation 700, and at operation 702, a request for compression of a data file or data stream is generated. The compression request can be generated by an application operating on the computer system. In addition, the compression request can be generated once for each data file or each data stream or can be generated for each data block included in the requested data file or data stream.

At operation 704, a determination is made as to whether the hardware component included in the computer system is updated and includes updated encoding software, or whether the hardware component is not updated and does not include updated encoding software. When the hardware component (e.g., the compression accelerator) is not updated and does not include updated encoding software, the hardware component switches off a hardware update flag at operation 706. In at least one embodiment, the hardware update flag indicator is switched off by generating a protocol data block having a hardware update bit field set to a first value (e.g., a "0" bit). When, however, the hardware component (e.g., the compression accelerator) is updated and includes updated encoding software, the hardware component switches on a hardware update flag indicator at operation 708. In at least one embodiment, the hardware update flag indicator is switched on by generating the protocol data block having the hardware update bit field set to a second value (e.g., a "1" bit).

At operation 710, a determination is made as to whether the OS included in the computer system is updated to support updated encoding software, or whether the OS is not updated and cannot support the updated encoding software. When the OS is not updated, the OS switches off an encoding status flag indicator at operation 712. In at least one embodiment, the encoding status flag indicator is switched off when the OS generates a protocol data block having an encoding status bit field set that is set to a first value (e.g., a "0" bit). When, however, the OS is updated, the OS switches on the encoding status flag at operation 714. In at least one embodiment, the encoding status flag indicator is switched on by generating the protocol data block having the encoding status bit field set to a second value (e.g., a "1" bit).

At operation 716, a determination is made as to whether the compression library currently used by the application is updated to support updated encoding software, or whether the compression library is not updated and cannot support the updated encoding software. When the compression library is not updated, the compression library switches off a compression library update status flag indicator at operation 718. In at least one embodiment, the compression library update status flag indicator is switched off when the compression library generates a protocol data block having a compression library update bit field set that is set to a first value (e.g., a "0" bit). When, however, the compression library is updated, the compression library switches on the compression library update status flag indicator at operation 720. In at least one embodiment, the compression library update status flag indicator is switched on by generating the protocol data block having the compression library update status bit field set to a second value (e.g., a "1" bit).

Turning to operation 722 (see FIG. 7B), the various flag indicators are analyzed to determine the update status of the hardware component, the OS, and the compression library. For example, a determination is made as to whether the hardware update flag indicator, the encoding status flag indicator, and the compression library update status flag indicator are each turned on. When the hardware update flag indicator, the encoding status flag indicator, and the compression library update status flag indicator are all turned on, the method proceeds to operation 724 and generates compressed data using updated encoding software (e.g., using an updated compression accelerator). At operation 726, the compressed data is delivered to the compression library, and a dynamic EOB symbol is determined at operation 728. The dynamic EOB symbol can be either be provided by the OS to the compression library and/or can be calculated by the compression library itself. At operation 730, the dynamic EOB symbol is added to the EOB of the compressed data, and the method ends at operation 732.

When, however, the hardware update flag indicator, the encoding status flag indicator, and the compression library update status flag indicator are not all turned on, the method proceeds to operation 734 and determines the status of the hardware update flag indicator. When the hardware update flag indicator is turned off, the method proceeds to operation 736 and compresses the requested data using non-updated (e.g., legacy) encoding software. At operation 738, the compressed data is delivered to the compression library for additional compression processing according to a non-updated encoding scheme. The additional processing includes, for example, adding a static preset EOB symbol set by the non-updated encoding scheme into the EOB of the compressed data at operation 740. Accordingly, the method ends at operation 742.

As described above, at least one embodiment provides that the OS 215 is tied to the update status of the hardware component 205. For example, when the hardware component 205 is updated (e.g., replaced with an up-to-date version), then a new OS 215 or updated OS 215 (e.g., the most up-to-date version of the OS) is installed to provide an updated device driver 220 that is compatible with the new or updated hardware component 205. Therefore when the hardware update flag indicator is turned on at operation 734, the method proceeds to operation 744 (see FIG. 7C) and determines that the OS update flag indicator is turned on, while the compression library update status flag indicator has already been determined to be switch turned off (i.e. at operation 722). Accordingly, the requested data is compressed using the updated encoding software (e.g., an updated compression accelerator) at operation 746. At operation 748, the compressed data is modified to generate modified compressed data, which is compatible with the non-updated compression library. At operation 750, the modified compressed data is delivered to the compression library for additional compression processing according to a non-updated encoding scheme. The additional processing includes, for example, adding a static preset EOB symbol set by the non-updated encoding scheme into the EOB of the modified compressed data at operation 752. Accordingly, the method ends at operation 754.

As described herein, various non-limiting embodiments provide a computer system that can compress data according to different encoding schemes, while still supporting legacy encoding that utilizes statically linked software code such as, for example, a data compression library (e.g., compression library). When the hardware component, OS, and/or compression library are not up-to-date, the computer system invokes a partial operating compression mode where the computer system performs data compression, albeit at a lower compression ratio efficiency. When, however, each of the hardware component, OS, and compression library are up-to-date (i.e., fully compatible with one another), the computer system can operate in a full operating compression mode which supports the new or up-to-date encoding scheme, and performs data compression at its full potential (e.g., at the most efficient compression ratio).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/ or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer system comprising:
a host system configured to run an application including at least one compression library and a dynamic end-of-block (EOB) symbol generator, the application outputting a compression request to compress a data stream having an initial data-representation size;
a hardware controller configured to compress the data stream according to an encoding scheme indicated by the compression library to generate a compressed data stream having a reduced data-representation size with respect to the initial data-representation size; and
an operating system (OS) configured to provide a communication interface between the hardware controller and the application and to exchange at least one protocol data block between the application and the hardware controller, the at least one protocol data block identifying an update status of at least one of the compression library and the OS,
wherein the computer system selectively operates in a first compression mode and a second compression mode based on the update status, thereby varying a compression ratio of the compressed data stream, and
wherein the dynamic EOB symbol generator selectively generates a dynamic EOB symbol and injects the dynamic EOB symbol into the compressed data stream based on the update status, the EOB symbol indicating an end point of the compressed data stream.

2. The computer system of claim 1, wherein the update status further includes an update status of the hardware controller.

3. The computer system of claim 2, wherein the compression ratio is a first reduced compression ratio when the compression library and the OS are both updated, and the compression ratio is a second reduced compression ratio when at least one of the compression library and the OS is not updated, the second reduced compression ratio being greater than the first reduced compression ratio.

4. The computer system of claim 3, wherein the compression library indicates a first encoding scheme when the compression library and the OS are both updated, and indicates a different second encoding scheme when at least one of the compression library and the OS is not updated.

5. The computer system of claim 4, wherein the first encoding scheme includes injecting, via the dynamic EOB symbol generator, the dynamic EOB symbol into the EOB, the second encoding scheme includes injecting a static preset EOB symbol, known prior to the compression request, to the EOB.

6. The computer system of claim 5, wherein the OS modifies the compressed data stream prior to the compression library adding the static preset EOB symbol.

7. The computer system of claim 6, wherein the modified compressed data is generated in response to adding compatibility data to the compressed data stream and then adding a static preset EOB symbol, determined prior to the compression request, to the EOB.

8. A computer-implemented method of controlling a computer system to compress data, the method comprising:
running, on a host system of the computer system, an application including at least one compression library and a dynamic end-of-block (EOB) symbol generator;
outputting a compression request, via the application, to compress a data stream having an initial data-representation size;
compressing the data stream, via a hardware controller, according to an encoding scheme indicated by the compression library to generate a compressed data stream having a reduced data-representation size with respect to the initial data-representation size;
establishing, via an operating system (OS) installed on the computer system, a data interface between the hardware controller and the application;
exchanging at least one protocol data block between the application and hardware controller to identify an update status of at least one of the compression library and the OS;
selectively operating the computer system in a first compression mode and a second compression mode based on the update status, thereby varying a compression ratio of the compressed data stream;

selectively generating, via the dynamic EOB symbol generator, a dynamic EOB symbol; and injecting, via the dynamic EOB symbol generator, the dynamic EOB symbol into the compressed data stream on the update status to indicate an end point of the compressed data stream.

9. The method of claim 8, further comprising:

identifying an update status of the hardware controller; and selectively operating the computer system in the first compression mode and the second compression mode based on the update status of each of the application, the OS, and the hardware controller.

10. The method of claim 9, wherein the compression ratio is a first reduced compression ratio when the compression library and the OS are both updated, and the compression ratio is a second reduced compression ratio when at least one of the compression library and the OS is not updated, the second reduced compression ratio being greater than the first reduced compression ratio.

11. The method of claim 10, further comprising:

determining a first encoding scheme when the compression library and the OS are both updated; and determining a different second encoding scheme when at least one of the compression library and the OS is not updated.

12. The method of claim 11, further comprising:

in response to invoking the first encoding scheme:
determining, via the via the dynamic EOB symbol generator, the EOB symbol;
injecting, via the via the dynamic EOB symbol generator, the EOB symbol into the EOB; and in response to invoking the second encoding scheme:
injecting a static preset EOB symbol into the EOB, the static preset EOB symbol determined prior to the compression request.

13. The method of claim 12, further comprising modifying, via the OS, the compressed data stream prior to the compression library adding the static preset EOB symbol.

14. The method of claim 13, further comprising generating the modified compressed data in response to adding compatibility data to the compressed data stream and then adding the static preset EOB symbol, known prior to the compression request, to the EOB.

15. A computer program product to control a computer system to compress data, the computer program product comprising a computer readable storage medium having program instructions embodied therewith, the program instructions executable by an electronic computer processor to perform operations comprising:

running, on a host system of the computer system, an application including a compression library and a dynamic end-of-block (EOB) symbol generator;

outputting a compression request, via the application, to compress a data stream having an initial data-representation size;

compressing the data stream, via a hardware controller, according to an encoding scheme indicated by the compression library to generate a compressed data stream having a reduced data-representation size with respect to the initial data-representation size;

establishing, via an operating system (OS) installed on the computer system, a data interface between the hardware controller and the application;

exchanging at least one protocol data block between the application and hardware controller to identify an update status of at least one of the compression library and the OS;

selectively operating the computer system in a first compression mode and a second compression mode based on the update status, thereby varying a compression ratio of the compressed data stream;

selectively generating, via the dynamic EOB symbol generator a dynamic EOB symbol; and injecting the dynamic EOB symbol into the compressed data stream on the update status to indicate an end point of the compressed data stream.

16. The computer program product of claim 15, further comprising:

identifying an update status of the hardware controller; and selectively operating the computer system in the first compression mode and the second compression mode based on the update status of each of the application, the OS, and the hardware controller.

17. The computer program product of claim 16, wherein the compression ratio is a first reduced compression ratio when the compression library and the OS are both updated, and the compression ratio is a second reduced compression ratio when at least one of the compression library and the OS is not updated, the second reduced compression ratio being greater than the first reduced compression ratio.

18. The computer program product of claim 17, further comprising:

determining a first encoding scheme when the compression library and the OS are both updated; and determining a different second encoding scheme when at least one of the compression library and the OS is not updated.

19. The computer program product of claim 18, further comprising:

in response to invoking the first encoding scheme:
determining, via the dynamic EOB symbol generator, the dynamic EOB symbol;
injecting, via the dynamic EOB symbol generator, the EOB symbol into an EOB; and in response to invoking the second encoding scheme:
injecting a static preset EOB symbol into the EOB included in the compressed data stream, the static preset EOB symbol determined prior to the compression request.

20. The computer program product of claim 19, further comprising modifying, via the OS, the compressed data stream prior to the compression library adding the static preset EOB symbol, wherein modifying the compressed data stream comprises:

generating the modified compressed data in response to adding compatibility data to the compressed data stream; and adding the static preset EOB symbol, known prior to the compression request, to the EOB.

* * * * *